(12) United States Patent
Lee et al.

(10) Patent No.: US 6,912,257 B1
(45) Date of Patent: Jun. 28, 2005

(54) APPARATUS AND METHOD FOR NORMALIZING METRIC VALUES IN A COMPONENT DECODER IN A MOBILE COMMUNICATION SYSTEM

(75) Inventors: Ynung-Hwan Lee, Songnam-shi (KR); Min-Goo Kim, Suwon-shi (KR); Beong-Jo Kim, Songnam-shi (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 09/559,691

(22) Filed: Apr. 27, 2000

(30) Foreign Application Priority Data

Apr. 28, 1999 (KR) ........................................ 1999-15223

(51) Int. Cl.$^7$ ................................................ H03D 1/00
(52) U.S. Cl. .................................... 375/340; 375/265
(58) Field of Search .............................. 375/316, 340, 375/341, 324, 265, 254; 714/792, 793, 759, 760, 789, 791, 794, 795, 796

(56) References Cited

U.S. PATENT DOCUMENTS

| | | | | |
|---|---|---|---|---|
| 4,802,174 A | * | 1/1989 | Hiraiwa et al. | 714/789 |
| 5,214,672 A | * | 5/1993 | Eyuboglu et al. | 375/254 |
| 5,349,608 A | * | 9/1994 | Graham et al. | 375/341 |
| 5,548,684 A | * | 8/1996 | Wang et al. | 706/16 |
| 5,724,394 A | * | 3/1998 | Ikeda et al. | 375/341 |
| 5,859,861 A | * | 1/1999 | Oh | 714/795 |
| 5,960,011 A | * | 9/1999 | Oh | 714/789 |
| 5,968,201 A | * | 10/1999 | Shida et al. | 714/795 |
| 6,122,118 A | * | 9/2000 | Sato et al. | 360/45 |
| 6,208,713 B1 | * | 3/2001 | Rahrer et al. | 379/67.1 |
| 6,483,881 B1 | * | 11/2002 | Kim et al. | 375/341 |

FOREIGN PATENT DOCUMENTS

| | | |
|---|---|---|
| JP | 06-164422 | 6/1994 |
| JP | 07-226035 | 8/1995 |
| JP | 08-008763 | 1/1996 |
| WO | WO 98/18209 | 4/1998 |

OTHER PUBLICATIONS

Japanese Office Action dated Jun. 24, 2003 issued in a counterpart application, namely Appln. No. 2000-616131.

* cited by examiner

*Primary Examiner*—Emmanuel Bayard
(74) *Attorney, Agent, or Firm*—Dilworth & Barrese LLP

(57) ABSTRACT

Disclosed is a method for normalizing metric values in a decoder which uses a plurality of metric values of a next state in a state transition period having a present state and the next state, each metric value having a survival path metric value having a value equal to or higher than a competition path metric value. The method comprises detecting the survival path metric values out of the metric values; detecting a minimum survival path metric value out of the detected survival path metric values; determining whether the detected minimum survival path metric value exceeds a threshold value; and subtracting, when the minimum survival path metric value exceeds the threshold value, a given normalization value from the metric values, to output normalized metric values. Also disclosed is another method for: normalizing metric values in a decoder which uses a plurality of metric values of a next state in a state transition period having a present state and the next state, each metric value having a survival path metric value having a value equal to or higher than a competition path metric value. The method comprises detecting the competition path metric values out of the metric values; detecting a minimum competition path metric value out of the detected competition path metric values; determining whether the detected minimum competition path metric value is greater than a threshold value; and subtracting, when the minimum competition path metric value is greater than the threshold value, a given normalization value to output normalized metric values.

5 Claims, 8 Drawing Sheets

APPARATUS AND METHOD FOR NORMALIZING METRIC VALUES IN A COMPONENT DECODER IN A MOBILE COMMUNICATION SYSTEM

PRIORITY

This application claims priority to an application entitled "Apparatus and Method for Normalizing Metric Value of Component Decoder in Mobile Communication System" filed in the Korean Industrial Property Office on Apr. 28, 1999 and assigned Serial No. 99-15223, the contents of which are hereby incorporated by reference.

BACKGROUND OF THE INVENTION

1. Field of the Invention

The present invention relates generally to an iterative decoding device and method for a mobile communication system, and in particular, to a device and method for normalizing a metric value accumulated in a component decoder of an iterative decoder in a mobile communication system.

2. Description of the Related Art

In general, iterative decoding is employed in mobile communication systems such as an IMT-2000 (or CDMA-2000) system and a UMTS system, which use a turbo code. Also, iterative decoding is employed in deep space communication systems and satellite communication systems, which use concatenated convolutional codes, concatenated block codes or product codes. The technical field of iterative decoding is related to soft decision and optimal performance of an error correction code.

FIG. 1 shows a common iterative decoder comprising two component decoders. Referring to FIG. 1, a first component decoder 101 receives an input codeword $X_k$, which is systematic information, a redundancy bit $Y_{1k}$ provided from a demultiplexer 107 (which demultiplexes input redundancy bits $Y_k$ which are parity information), and first extrinsic information Ext. The first component decoder 101 performs decoding on the received signals to output a primarily decoded signal relating to the decoding results. The decoded signal is comprised of codeword ingredient $X_k$ and a second extrinsic information ingredient. An interleaver 103 interleaves the primarily decoded signal. A second component decoder 105 receives the primarily decoded signal output from the interleaver 103 and a redundancy bit $Y_{2k}$ provided from the demultiplexer 107. The second component decoder 105 decodes the received primarily decoded signal and the redundancy bit $Y_{2k}$ to output a secondarily decoded signal including the first extrinsic information ingredient. Further, the second component decoder 105 provides the extrinsic information Ext to the first component decoder 101 through a deinterleaver 109.

FIG. 2 shows a detailed block diagram of a component decoder. Referring to FIG. 2, the component decoder 101 includes a branch metric calculation part (BMC) 113 for performing branch metric calculation and an add & compare & selection part (ACS) 115 for performing metric calculation and comparison in each state to select a path having fewer errors.

In general, such an iterative decoder calculates a metric value $M_t$ in accordance with Equation 1 below.

$$M_t = M_{t-1} + (u_t \times Lc \times y_{t,1}) + \left[\sum_{j=2}^{N} x_{t,j} \times Lc \times y_{t,j}\right] + (u_1 \times L(u_1)) \quad \text{Eq. 1}$$

where, $M_t$: accumulated metric value for time t,
$u_t$: codeword for the systematic bit,
$x_{tj}$: codeword for the redundancy bit,
$y_{tj}$: received value for the channel (systematic+redundancy)
Lc: channel reliability value, and
$L(u_t)$: a-priori reliability value for time t It is noted from Equation 1 that with each metric calculation, the metric value $M_t$ continuously grows due to the second, third and fourth terms. In particular, the accumulation of a high-channel reliability value, i.e., the extrinsic information having the decoding result information, causes overflow. Therefore, for hardware implementation, the metric values should have a value within a specific range to avoid an overflow problem. However, the fundamental purpose of an iterative decoder is to perform iterative decoding in order to improve decoding performance (i.e., reducing BER (Bit Error Rate) or FER (Frame Error Rate)). But, after successive iterations, the metric values may increase to exceed this specific range. Thus, if a specific range for the metric values is presumed when designing the hardware of the decoder, a problem will occur when the metric value exceeds the range and creates an overflow problem.

SUMMARY OF THE INVENTION

It is, therefore, an object of the present invention to provide a device and method for normalizing the accumulated metric values of each present state to prevent generation of overflow or underflow in a component decoder for a mobile communication system.

It is another object of the present invention to provide a device and method for normalizing metric values on a survival path to prevent generation of overflow in a mobile communication system.

It is further another object of the present invention to provide a device and method for normalizing metric values on a competition path to prevent generation of underflow in a mobile communication system.

To achieve the above and other objects, there is provided a method for normalizing metric values in a decoder which uses a plurality of metric values of a next state in a state transition period having a present state and the next state, each metric value having a survival path metric value having a value equal to or higher than a competition path metric value. The method comprises detecting the survival path metric values out of the metric values; detecting a minimum survival path metric value out of the detected survival path metric values; determining whether the detected minimum survival path metric value exceeds a threshold value; and subtracting, when the minimum survival path metric value exceeds the threshold value, a given normalization value from the metric values, to output normalized metric values.

There is also provided a method for normalizing metric values in a decoder which uses a plurality of metric values of a next state in a state transition period having a present state and the next state, each metric value having a survival path metric value having a value equal to or higher than a competition path metric value. The method comprises detecting the competition path metric values out of the metric values; detecting a minimum competition path metric value out of the detected competition path metric values; determining whether the detected minimum competition path metric value is greater than a threshold value; and subtracting, when the minimum competition path metric value is greater than the threshold value, a given normalization value to output normalized metric values.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

A component decoder according to the present invention includes a branch metric calculation part 113 and a normalization part 115. The branch metric calculation part 113 performs branch metric calculation on the received extrinsic information, codeword and redundancy bits, and provides its outputs to the normalization part 115. The normalization part 115 receives metric values from the branch metric calculation part 113 and performs addition, comparison and selection (ACS) on survival path metric values and competition path metric values. Further, when state values of the survival path-metric values or the competition path metric values exceed a threshold value, the normalization part 115 normalizes the metric values by subtracting a specific value therefrom.

There are two methods for normalizing the accumulated metric values according to the present invention. A first method uses the accumulated survival path metric values, and a second method uses the accumulated competition path metric values.

A. First Embodiment

Figure 1:
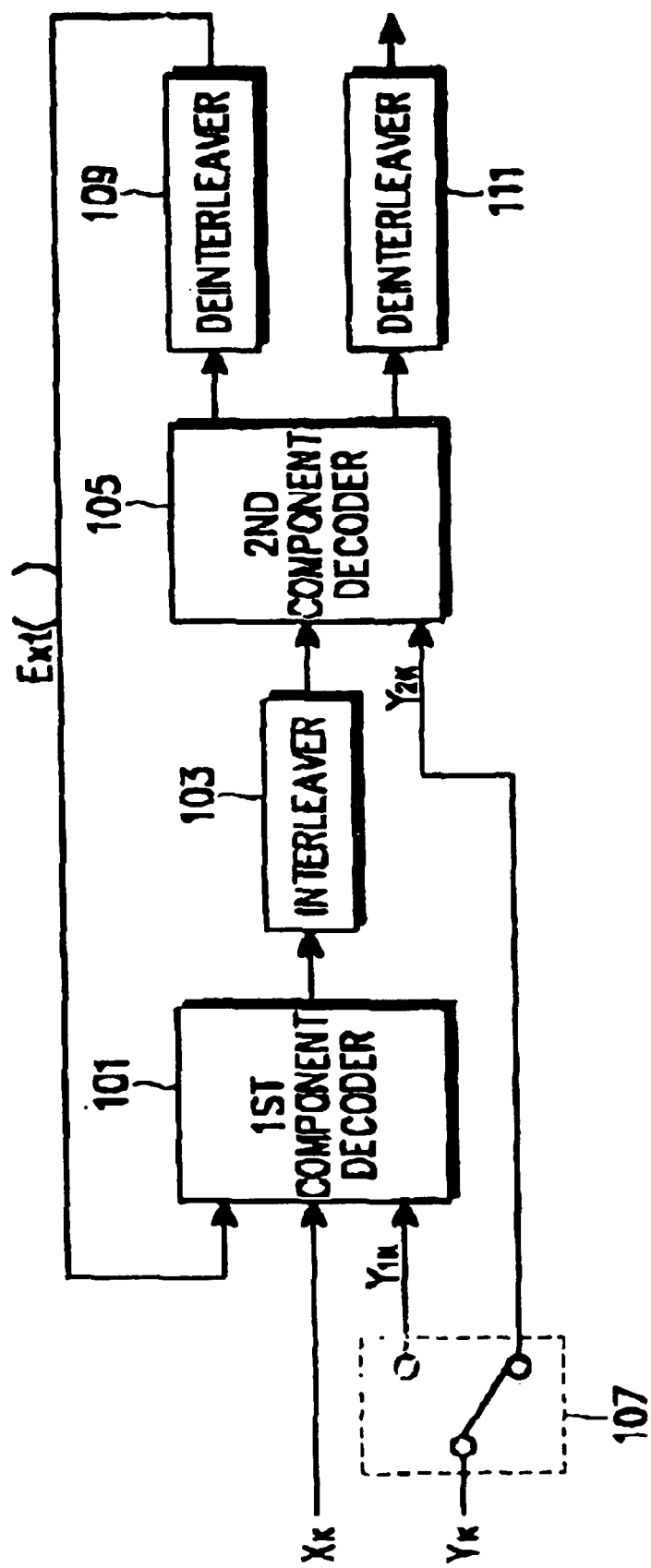
FIG. 1 is a block diagram illustrating a general iterative decoder including two component decoders.
Figure 2:
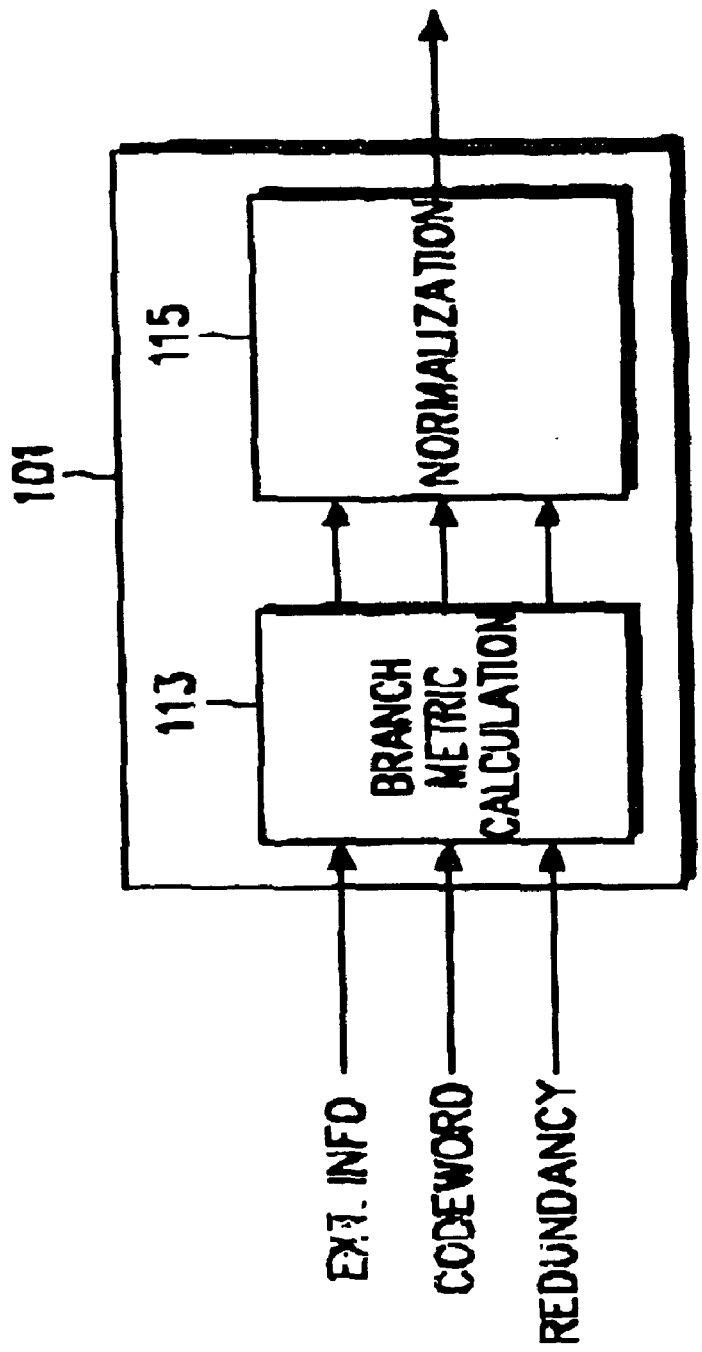
FIG. 2 is a detailed block diagram illustrating the component decoders of FIG. 1.
Figure 3:
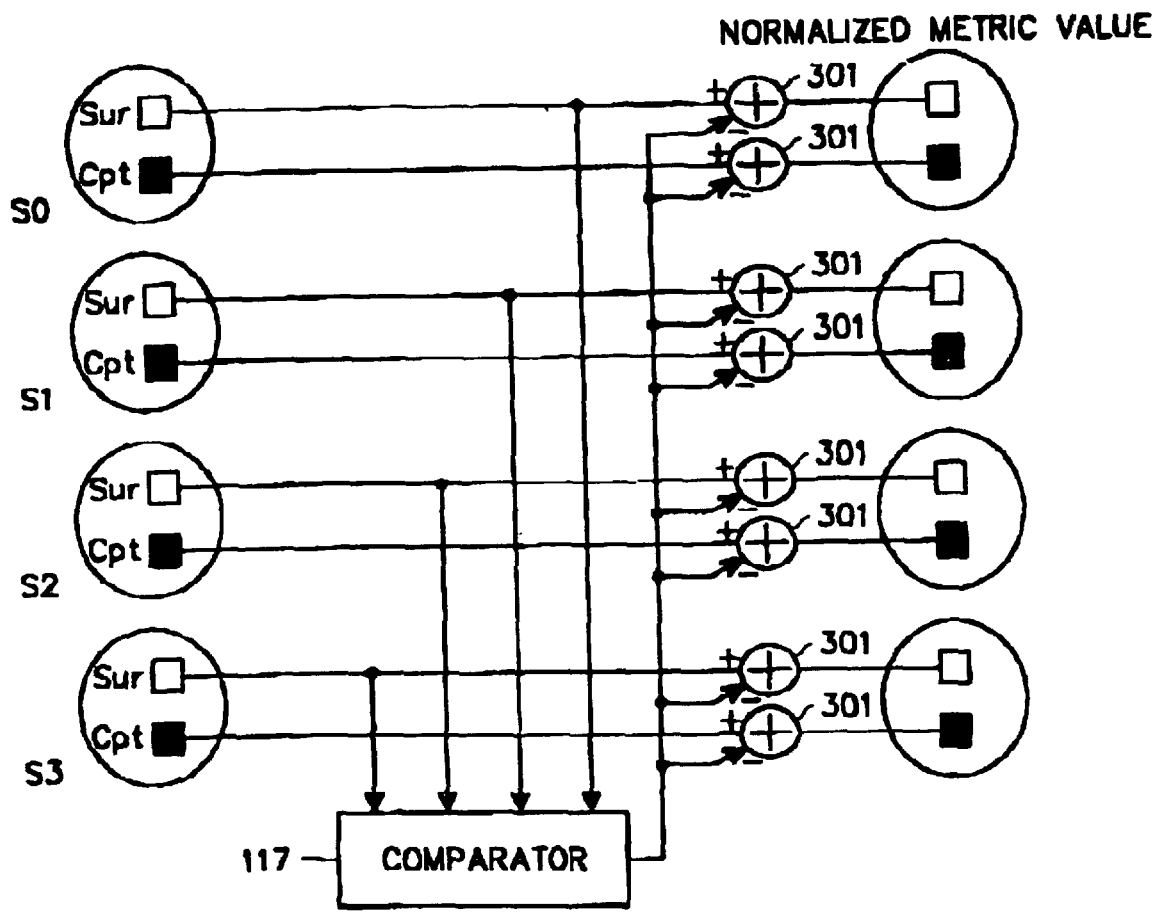
FIG. 3 is a schematic diagram illustrating a metric value normalization device in the ACS of the component decoder according to a first embodiment of the present invention.

First, with reference to FIGS. 3 and 4, the first normalization method will be described. FIG. 3 shows, for a constraint length K=3, how the normalization part 115 transitions to the next state according to a first embodiment of the present invention. FIG. 4 shows values of the states shown in FIG. 3. The metric value normalization device according to the first embodiment of the present invention will be described with reference to FIGS. 3 and 4. Herein, the "metric values" refer to a plurality of metric values each including a pair of the survival path metric values and the competition path metric values.

Figure 4A:
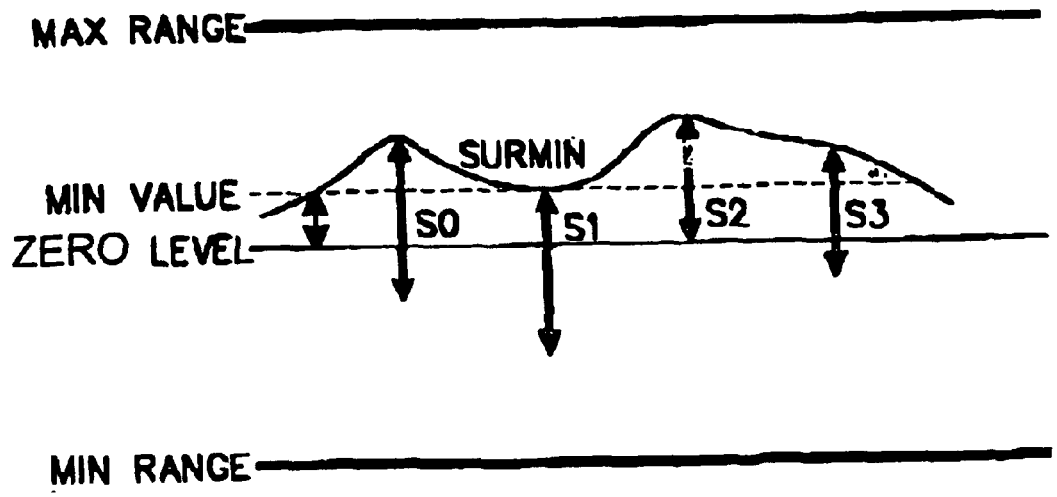
FIGS. 4A and 4B show a method for normalizing metric values according to the first embodiment of the present invention.
Figure 4B:
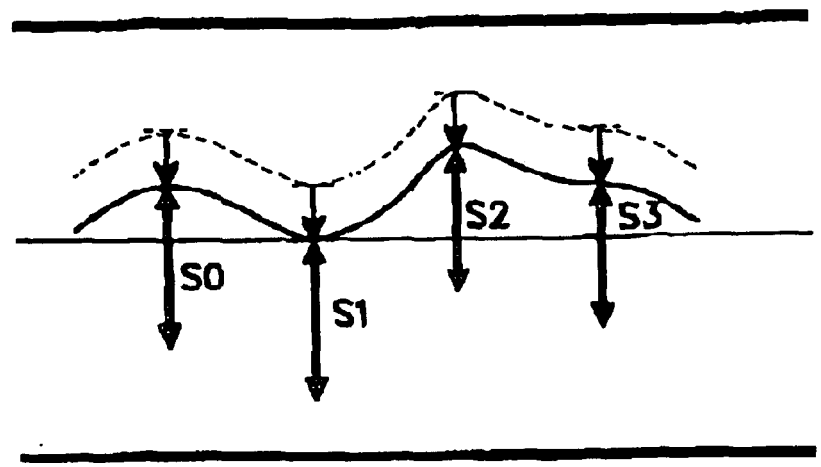

For K=3, the number of memories is 2 and the number of possible states is 4. Each state includes the survival path metric value "Sur" and the competition path metric value "Cpt". The survival path metric values and the competition path metric values of the next state are determined by adding their branch metrics to the survival path metric and the competition path metric when transitioning to the next state. The branch metric value-added metric values are compared to select the higher value so as to determine a metric value of the next state. Here, a surviving metric is the survival path metric. Although the competition path metric is never selected, it continuously transitions along with the survival path metric. Although FIG. 3 shows a transition between the states having the same state index, the next state index can be varied according to the properties of the component decoder. The metric values of the present states are applied to associated adders 301. A comparator 117 detects the survival path metric values Sur out of the metric values of the present states. After detecting the survival path metric values Sur, the comparator 117 selects the minimum Sur value $Sur_{MIN}$ from the detected Sur values and provides the selected $Sur_{MIN}$ value to be subtracted in the adders 301 (as indicated by the negative sign in FIG. 3). Here, subtraction can be performed only when the $Sur_{MIN}$ value exceeds a threshold value. This is to avoid performing subtraction when the Sur values are already small. The adders 301 subtract the $Sur_{MIN}$ value from the corresponding Sur values to output normalized Sur metric values. In FIG. 4A, the Sur value of the state S1 is the minimum Sur value. As shown in FIG. 4B, the Sur values of the respective states S0–S3 are reduced by subtracting the $Sur_{MIN}$ value therefrom.

Figure 5:
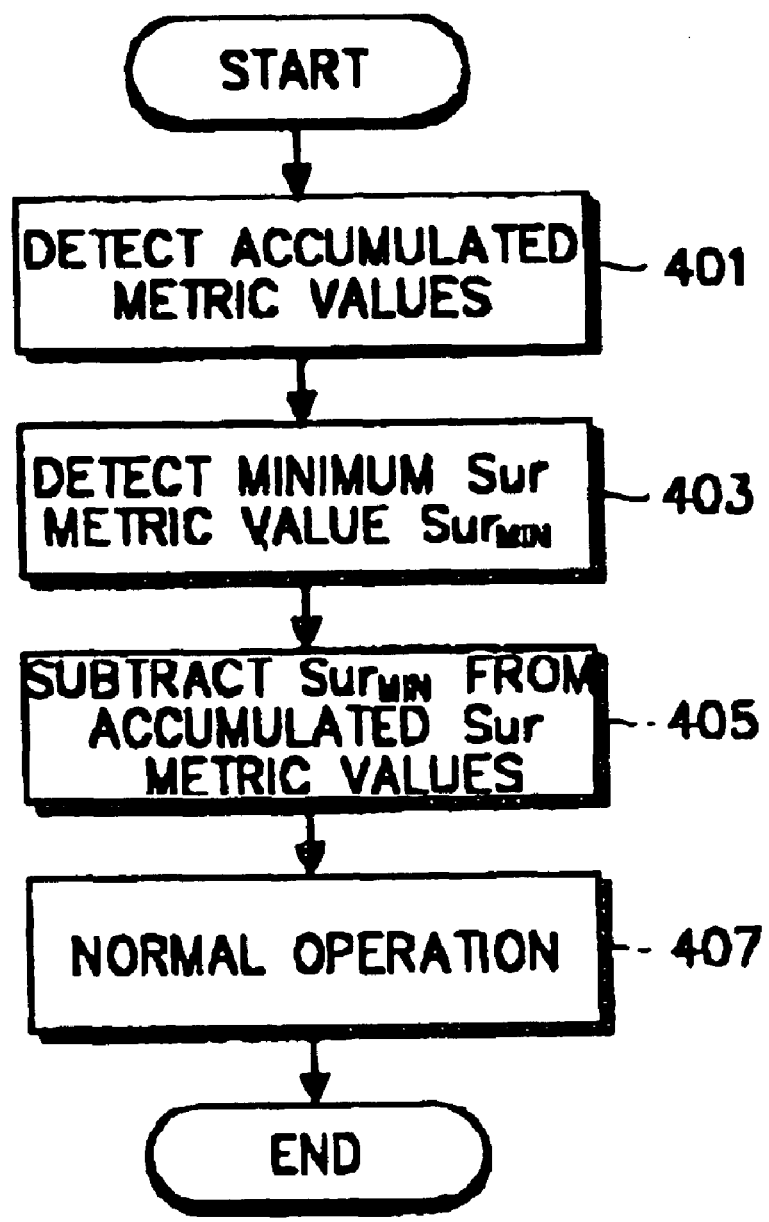
FIG. 5 is a flow chart illustrating a metric value normalization procedure according to the first embodiment of the present invention.

FIG. 5 shows a method for normalizing accumulated metric values according to the first embodiment of the present invention.

Referring to FIG. 5, the comparator 117 detects metric values Sur for the four present states in step 401. After detecting the metric values Sur, the comparator 117 detects the minimum Sur value $Sur_{MIN}$ out of the metric values Sur in step 403. After detecting the Sur values and the $Sur_{MIN}$ value in steps 401 and 403, the comparator 117 transfers the $Sur_{MIN}$ value to be subtracted from the respective Sur values to normalize the Sur values in step 405, and the normal addition, comparison and selection operation is performed in step 407.

B. Second Embodiment

Figure 6:
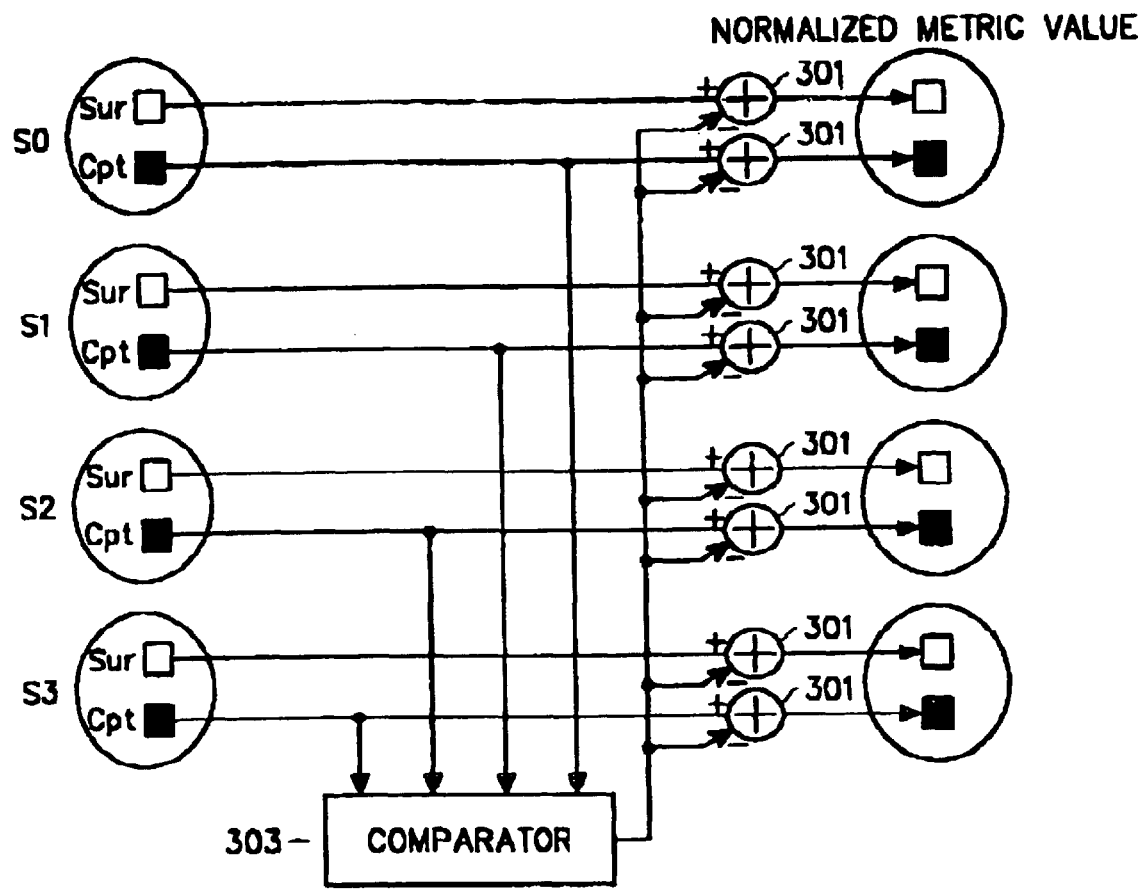
FIG. 6 is a schematic diagram illustrating a metric value normalization device in the ACS of the component decoder according to a second embodiment of the present invention.
Figure 7A:
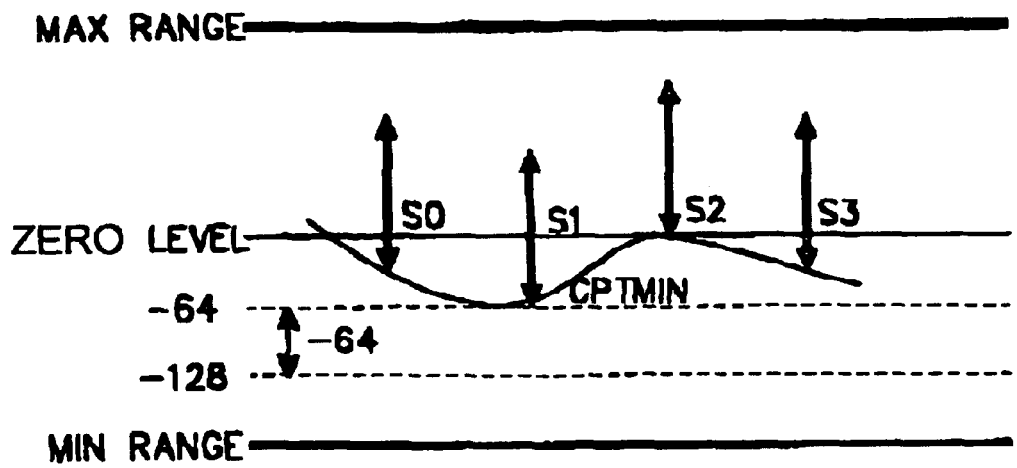
FIGS. 7A and 7B show a method for normalizing metric values according to the second embodiment of the present invention.
Figure 7B:
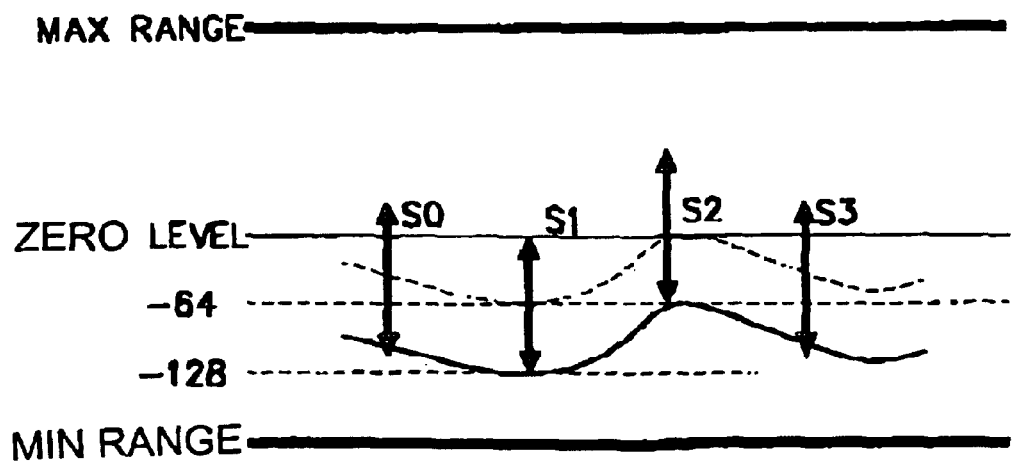
Figure 8:
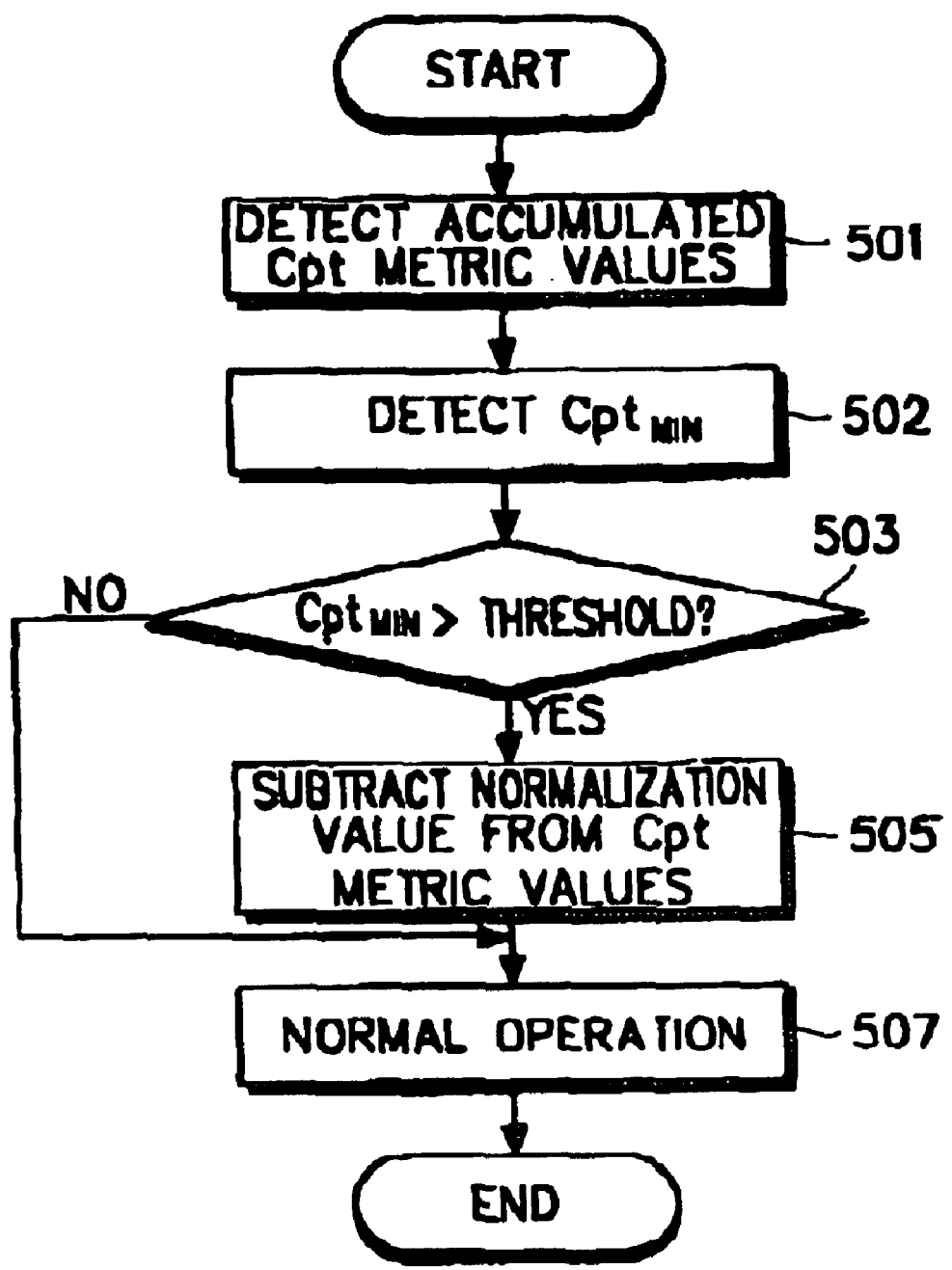
FIG. 8 is a flow chart illustrating a metric value normalization procedure according to the second embodiment of the present invention.

With reference to FIGS. 6 to 8, the second normalization method will be described. FIG. 6 shows a structure of the normalization part 115 according to the second embodiment of the present invention.

The second normalization method shown in FIG. 6 is a method for normalizing using the competition path metric values, while the first normalization method shown in FIG. 3 is a method for normalizing using the survival path metric values. As stated above, the competition path metric values have smaller values than the survival path metric values. This is because the competition path metric values have more error ingredients than the survival path metric values.

FIGS. 7A and 7B show the competition path metric values for the worst case, for convenience of explanation. Unlike the survival path metric, the competition path metric does not have the overflow problem. This is because the competition path metric values have smaller values than the survival path metric values. However, in the worst case, the competition path metric may have a underflow problem, as shown in FIGS. 7A and 7B. A structure of the normalization part for preventing the underflow will be described with reference to FIG. 6. The second embodiment will be described for the constraint length K=3 as in the first embodiment.

Sur metric values and Cpt metric values of the present states are applied to associated adders 301. A comparator 303 monitors the Cpt metric values to detect the Cpt metric values transitioning to the next states. After detecting the Cpt metric values, the comparator 303 detects the minimum Cpt metric value $Cpt_{MIN}$. After detecting the $Cpt_{MIN}$ value, the comparator 303 determines whether the $Cpt_{MIN}$ value is greater than a threshold value. When the $Cpt_{MIN}$ value is greater than a threshold value, the comparator 303 provides the adders 301 with a specific level value (hereinafter, referred to as a normalization value) determined through computer simulation, to subtract the normalization value to all the metric values, thereby to output the resulting normalized metric values to the corresponding next states. FIGS. 7A and 7B show the normalization process for the case where the threshold value is −64 and the normalization value is 64. Herein, it is noted that the Sur metric values are normalized to a specific level and the Cpt metric values have no underflow.

FIG. 8 shows a normalization method according to the second embodiment of the present invention. Referring to FIG. 8, the comparator 303 detects the accumulated Cpt metric values of the respective states in step 501. After detecting the accumulated Cpt metric values, the comparator 303 detects the minimum Cpt metric value $Cpt_{MIN}$ out of the Cpt metric values in step 502. After detecting the minimum Cpt metric value $Cpt_{MIN}$ the comparator 303 determines in step 503 whether the $Cpt_{MIN}$ value is greater than a threshold value. When the $Cpt_{MIN}$ value is greater than the threshold value, the comparator 303 provides a predetermined normalization value to the subtracters 301 to subtract the normalization value from all the metric values, thereby to output the normalized metric values to the next states. Thereafter, the normal addition, comparison and selection operation in the next transition state is performed in step 507. However, when the $Cpt_{MIN}$ value is less than the threshold value in step 503, the comparator 303 does not perform normalization to prevent underflow and proceeds to step 507 to perform the normal addition, comparison and selection operation in the next transition state.

As described above, the invention can prevent overflow and underflow errors by normalizing accumulated metric values, thereby making it possible to increase a memory utilization efficiency.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for normalizing metric values in a decoder which uses a plurality of metric values of a next state said each metric value having at least a survival path metric value and a competition path metric value, the method comprising the steps of:

detecting the survival path metric values of the metric values;

detecting a minimum survival path metric value out of the detected survival path metric values;

determining whether the detected minimum survival path metric value exceeds a threshold value; and subtracting, when the minimum survival path metric value exceeds the threshold value, the detected minimum survival path metric value from the detected survival path metric values, to output normalized metric values.

2. A device for normalizing metric values in a decoder which uses a plurality of metric values of a next state, said each metric value having at least a survival path metric value and a competition path metric value, the device comprising:

a comparator for detecting the survival path metric values out of the metric values, detecting a minimum survival path metric value out of the detected survival path metric values, and outputting the minimum survival path metric value when the detected minimum survival path metric value exceeds a threshold value; and subtracters for subtracting the detected minimum survival path metric value from the detected survival path metric values.

3. A method for normalizing metric values in a decoder which uses a plurality of metric values of a next state, said each metric value having at least a survival path metric value and a competition path metric value, the method comprising the steps of:

detecting the competition path metric values out of the metric values;

detecting a minimum competition path metric value out of the detected competition path metric values;

determining whether the detected minimum competition path metric value is greater than a threshold value; and subtracting, when the detected minimum competition path metric value is greater than the threshold value, a given normalization value from the metric values, to output normalized metric values.

4. A device for normalizing metric values in a decoder which uses a plurality of metric values of a next state, said each metric value having at least a survival path metric value and a competition path metric value, the device comprising:

a comparator for detecting the competition path metric values out of the metric values, detecting a minimum competition path metric value out of the detected competition path metric values, and outputting a reference metric value when the detected minimum competition path metric value is greater than a threshold value; and subtracters for subtracting the reference metric value from the detected competition path metric values.

5. A method of normalizing metric values in a decoder which uses a plurality of next state metric values, each of said metric values having at least a survival path metric value and a competition path metric value, the method comprising the steps of:

detecting the survival path metric values out of the metric values;

detecting a minimum survival path metric value out of the detected survival path metric values;

determining whether the detected minimum survival path metric value exceeds a threshold value; and subtracting, when the minimum survival path metric value exceeds the threshold value, the minimum survival path metric value from the metric values, to output normalized metric values;

detecting the competition path metric values out of the metric values;

detecting a minimum competition path metric value out of the detected competition path metric value;

determining whether the detected minimum competition path metric value is greater than a threshold value; and subtracting, when the minimum competition path metric value is greater than the threshold value, a given normalization value from the metric values, to output normalized metric values.

* * * * *